(12) United States Patent
Lo et al.

(10) Patent No.: US 9,748,107 B2
(45) Date of Patent: Aug. 29, 2017

(54) METHOD FOR REMOVING SEMICONDUCTOR FINS USING ALTERNATING MASKS

(71) Applicant: Taiwan Semiconductor Manufacturing Co., Ltd., Hsin-Chu (TW)

(72) Inventors: Tzu-Chun Lo, New Taipei (TW); Min-Hung Cheng, Taipei (TW); Hsiao-Wei Su, Tainan (TW); Jeng-Shiun Ho, Hsin-Chu (TW); Ching-Che Tsai, Zhubei (TW); Cheng-Cheng Kuo, Hsinchu (TW); Hua-Tai Lin, Hsinchu (TW); Chia-Chu Liu, Shin-Chu (TW); Kuei-Shun Chen, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 123 days.

(21) Appl. No.: 14/920,965

(22) Filed: Oct. 23, 2015

(65) Prior Publication Data
US 2016/0042964 A1 Feb. 11, 2016

Related U.S. Application Data

(62) Division of application No. 13/792,923, filed on Mar. 11, 2013, now Pat. No. 9,184,101.

(51) Int. Cl.
| G03F 1/00 | (2012.01) |
| H01L 21/308 | (2006.01) |
| H01L 51/00 | (2006.01) |
| H01L 27/092 | (2006.01) |
| H01L 21/3213 | (2006.01) |
| H01L 21/033 | (2006.01) |
| H01L 27/12 | (2006.01) |
| H01L 21/8234 | (2006.01) |
| H01L 21/8238 | (2006.01) |
| H01L 21/84 | (2006.01) |

(52) U.S. Cl.
CPC ............ H01L 21/3083 (2013.01); G03F 1/00 (2013.01); H01L 21/0337 (2013.01); H01L 21/32139 (2013.01); H01L 21/823431 (2013.01); H01L 21/823821 (2013.01); H01L 21/845 (2013.01); H01L 27/0924 (2013.01); H01L 27/1288 (2013.01); H01L 51/0018 (2013.01)

(58) Field of Classification Search
CPC ................................. G03F 1/00; H01L 21/308
See application file for complete search history.

(56) References Cited

U.S. PATENT DOCUMENTS

| 8,039,179 | B2 | 10/2011 | Shieh et al. |
| 8,569,152 | B1 | 10/2013 | Basker et al. |
| 2010/0109086 | A1 | 5/2010 | Song et al. |
| 2011/0124134 | A1 | 5/2011 | Lin et al. |
| 2011/0151359 | A1 | 6/2011 | Shieh et al. |
| 2013/0203257 | A1 | 8/2013 | De et al. |

(Continued)

Primary Examiner — Stephen Rosasco
(74) Attorney, Agent, or Firm — Duane Morris LLP

(57) ABSTRACT

A mask set and method for forming FinFET semiconductor devices provides a complementary set of fin-cut masks that are used in DPT (double patterning technology) to remove fins from non-active areas of a semiconductor device, after the fins are formed. Adjacent fins, or adjacent groups of fins, are removed using pattern features from different ones of the multiple fin-cut masks.

20 Claims, 6 Drawing Sheets

(56) References Cited

U.S. PATENT DOCUMENTS

2013/0309838 A1 11/2013 Wei et al.
2014/0264717 A1 9/2014 Shieh et al.
2014/0273464 A1 9/2014 Shieh et al.

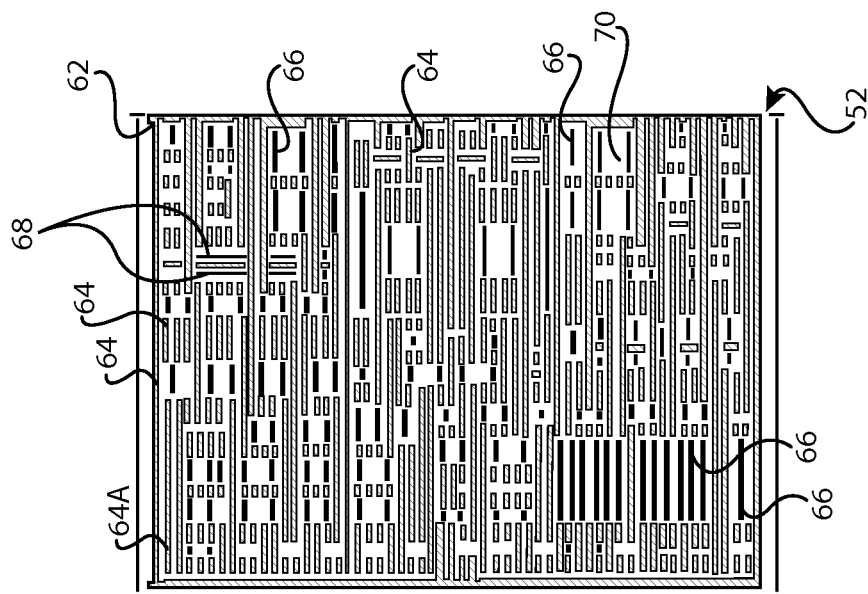
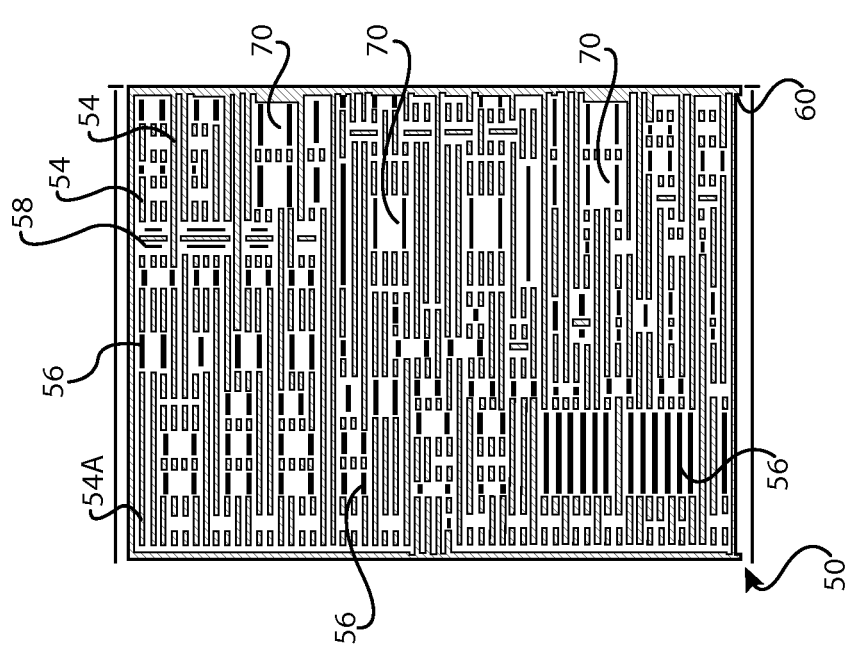
FIG. 3B
FIG. 3A

METHOD FOR REMOVING SEMICONDUCTOR FINS USING ALTERNATING MASKS

CROSS-REFERENCE TO RELATED APPLICATION

This application is a divisional of U.S. patent application Ser. No. 13/792,923, filed Mar. 11, 2013, and entitled "A METHOD FOR REMOVING SEMICONDUCTOR FINS USING ALTERNATING MASKS," the disclosure of which is incorporated herein by reference in its entirety.

TECHNICAL FIELD

The disclosure relates to semiconductor device manufacturing and, more particularly, to a mask set and method for forming FinFET semiconductor devices.

BACKGROUND

FinFET (fin field effect transistor) devices have become very popular in semiconductor device manufacturing because of the increased integration levels they provide. FinFET devices utilize fin-like structures formed over the surface of a substrate and provide increased surface area relative to planar semiconductor devices. Fins are generally formed of semiconductor material such as silicon and are narrow thin-like structures formed over the surface of a substrate. FinFET devices include field effect transistors formed on the fins. The added surface area provided by the fin is used as the channel and source/drain regions of the FinFET devices. Other active devices also utilize the additional area afforded by the fins. A greater number of FinFET devices than planar transistors, can be produced on a given footprint area of a substrate. Further, for a given footprint area on a substrate, a FinFET transistor can be formed to include larger source/drain areas, larger channel areas and larger gate areas than a comparable planar transistor formed on the substrate surface, thereby increasing the device speed for FinFETs. Fins are generally formed parallel to one another over a substrate for ease of manufacturing and due to limitations and photolithography and etching processes.

In the manufacture of FinFET devices, the fins are generally initially formed throughout the die including in active areas where they will be utilized and also in other areas where they are not needed. The fins are subsequently removed from areas where they are not needed. The removal of fins from some areas but not others is susceptible to patterning problems that are associated with non-uniformities and irregularities in the masks used to remove the fins from the undesired areas.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 3A and 3B show further details of two complementary fin-cut masks in accordance with an embodiment of the disclosure.

DETAILED DESCRIPTION

Figure 1:
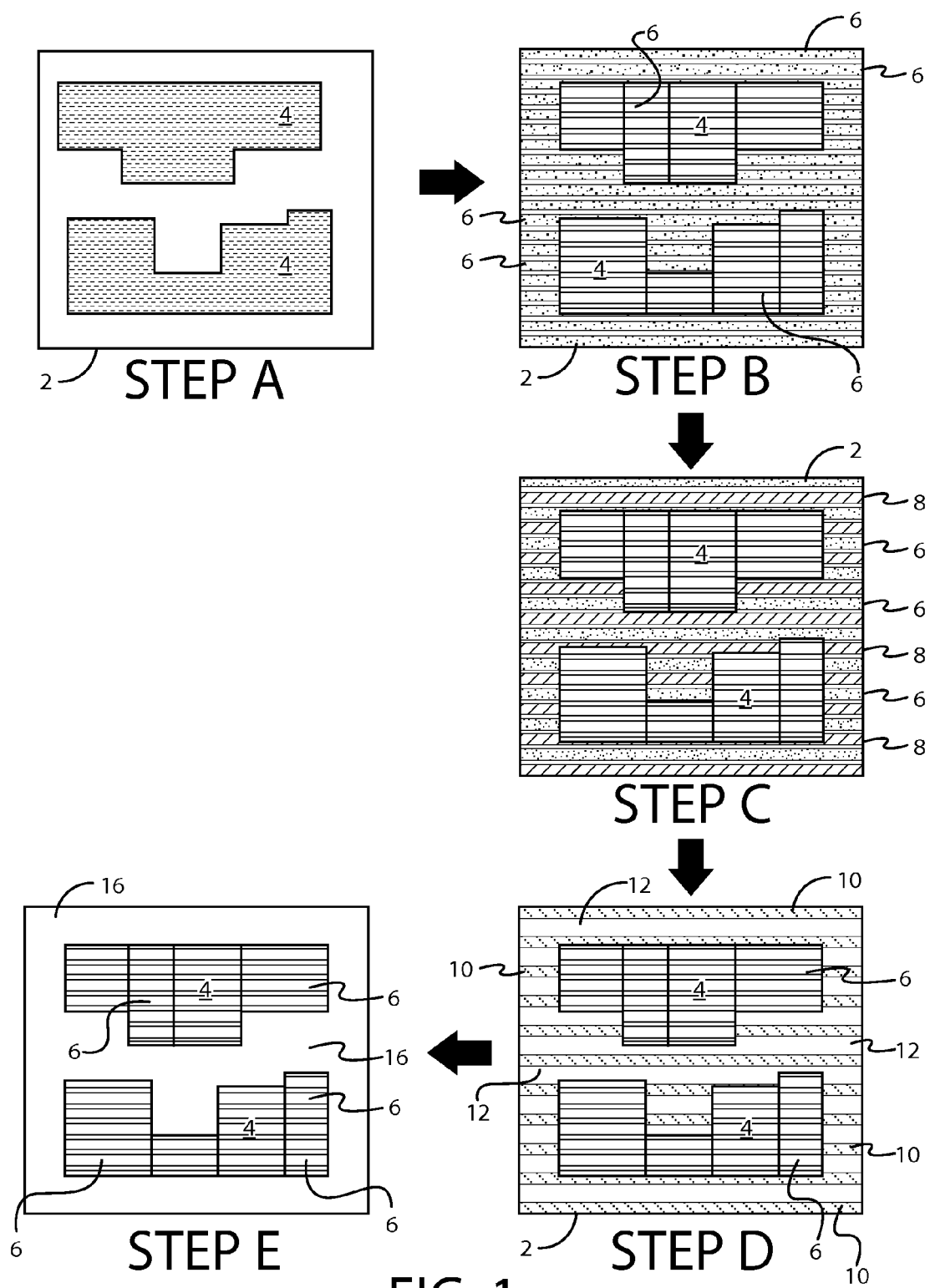
FIG. 1 shows a sequence of patterning/processing operations used to form fins in active areas according to an embodiment of the disclosure.

The disclosure provides a mask set and method for patterning a semiconductor device to produce semiconductor or other fins in active areas of the device. More particularly, the disclosure provides for defining an active area or active areas on a die, and forming a pattern of a plurality of parallel fins substantially throughout the die. The disclosure then provides for removing the patterned fins from areas other than active areas using two cooperating photomasks using double patterning technology ("DPT") techniques.

In some embodiments, the plurality of parallel fins formed on the die prior to removal is a photolithographic pattern of developed photoresist and in some embodiments, the plurality of parallel fins formed on the die prior to removal comprises the plurality of fin structures physically formed on the die using a photolithographic patterning operation followed by an etching operation. The cooperating masks used in conjunction with one another to remove the semiconductor fins from the non-active areas are used to develop away a photoresist pattern of the fins from areas outside of the active areas. In some embodiments, the fin-cut patterning operations include a photoresist coating and patterning operation used in conjunction with a further etching operation to remove the physical fin structures from areas outside of the active areas. In such embodiments, the DPT technology is 2P2E (two patterning; two etching steps) double patterning technology in which each patterning operation utilizes a photolithographic coating and patterning operation followed by an etching operation. According to other embodiments, only a photoresist pattern of the fins has been formed and the fin-cut patterning operations associated with each of the fin-cut masks does not require a separate photoresist coating operation as the fin-cut photolithographic operation involves the development of portions of the previously formed photoresist pattern.

Other embodiments, referred to as the cut-first embodiments, also utilize the fin-cut masks of the disclosure. In such cut-first embodiments, trenches that will contain fins are formed initially using the fin cut-masks and the fins are formed later by filling the trenches. The cut-first technology is described in U.S. patent application Ser. No. 12/625,957 filed on Nov. 25, 2009, entitled End-Cut First Approach for Critical Dimension Control, and published as US patent publication 2011/0124134, the contents of which are incorporated by reference, as if set forth in their entirety.

In some embodiments, two cooperating photomasks are used in conjunction with one another to remove the fins from the areas in which they are not desired, i.e. to remove them from areas other than the active areas in separate removal operations. The two cooperating masks are referred to as fin-cut masks because they each include a pattern of the fins, or portions of the fins, that are to be removed. In many embodiments, the features used to identify the portions of the fins to be removed, are strips corresponding to the patterned fins that are to be removed. In positive photoresist patterning technology, the strips are clear so that the photoresist is removed from over the fin when exposed. The clear areas form a pattern used to remove portions of fins from areas other than the active areas. In some embodiments, the clear areas are used in a photolithographic patterning operation to form a pattern used to expose, develop and remove portions of the fins corresponding to the clear strips. In some embodiments, each of the two fin-cut masks include only a number of strips that are parallel to one another and which form a pattern of fixed pitch throughout the mask.

The two cooperating masks each include fin-cut regions that include one or multiple strips, each strip corresponding to a fin. When the two cooperating fin-cut masks are overlayed over the fin pattern, they produce an alternating sequence of parallel fin-cut areas. Stated alternatively, adjacent fins or adjacent groups of fins are exposed and removed using patterns formed from different fin-cut photomasks. Each of the fin-cut photomasks includes a fixed pitch, in some embodiments.

FIG. 1 shows a sequence of five processing operations used to form a pattern of fins in an active area. Step A of FIG. 1 shows die 2 with two active areas 4. Active areas 4 are the areas in which semiconductor fins are desired on the finished semiconductor device. In some embodiments, active areas 4 are defined by one or more active area masks. The illustration of Step A is provided primarily to indicate the location of the active areas 4 and may or may not represent any physical processing that has already taken place on die 2. Step B of FIG. 1 shows fins 6 formed throughout die 2. Fins 6 are parallel. In some embodiments, Step B represents semiconductor fins physically formed by patterning and etching, on a semiconductor substrate within die 2. In other embodiments, the plurality of fins 6 represent a photolithographic pattern formed in die 2. Fins 6 may be of various dimensions and fins 6 include the same dimension and are separated by a constant pitch, in some embodiments. At Step B, active areas 4 are superimposed over fins 6 to indicate that fins 6 are present both in active areas 4 and outside active areas 4 at this point.

Now referring to Step C, a pattern including multiple fin-cut regions 8 is formed on die 2. Fin-cut regions 8 are part of a first fin-cut mask. Each fin-cut region 8 corresponds to a single fin or portions thereof, in the embodiment of Step C of FIG. 1 but in other embodiments, each fin-cut region 8 corresponds to two or more parallel fins. Fin-cut regions 8 do not extend over active areas 4. While fin-cut regions 8 are represented as being over and "covering" a corresponding fin 6 or portion of fin 6 that was shown at Step B in the illustrated embodiment, it should be understood that fin-cut regions 8 represent clear areas of a photomask according to the embodiment in which positive photoresist processing is used. In other words, in the positive photomask including fin-cut regions 8, the portions of the photomask other than fin-cut regions 8, are opaque.

A develop process or develop and etching processes are then used to remove fins 6 that correspond to fin-cut regions 8 shown in Step C, to produce the structure in Step D.

Step D shows void regions 12 from which fins were removed. Void regions 12 correspond to fin-cut regions 8 shown in Step C. The pattern formed on die 2 shown in Step D of FIG. 1 also includes fin-cut regions 10 of a second fin-cut mask. Fin-cut regions 10 are each formed over a corresponding fin 6 such as was shown in Step C. Fin-cut regions 10 do not, however, extend through active areas 4. Fin-cut regions 10 identify regions outside of active area 4 in which the underlying fins 6 (not shown beneath fin-cut regions 10 in FIG. 1) will be removed. It can be understood that, if the first and second fin-cut masks were superimposed over one another, the patterns including fin-cut regions 8 of one mask and fin-cut regions 10 of the other mask, would appear in an alternating sequence across die 2. Adjacent fins 6 are removed using fin-cut regions from different ones of the two fin-cut photomasks.

Step E of FIG. 1 shows active areas 4 including fins 6 and void areas 16 from which fins 6 have been removed using a first fin-cut photomask including fin-cut regions 8 and a second fin-cut photomask including fin-cut regions 10.

Figure 2A:
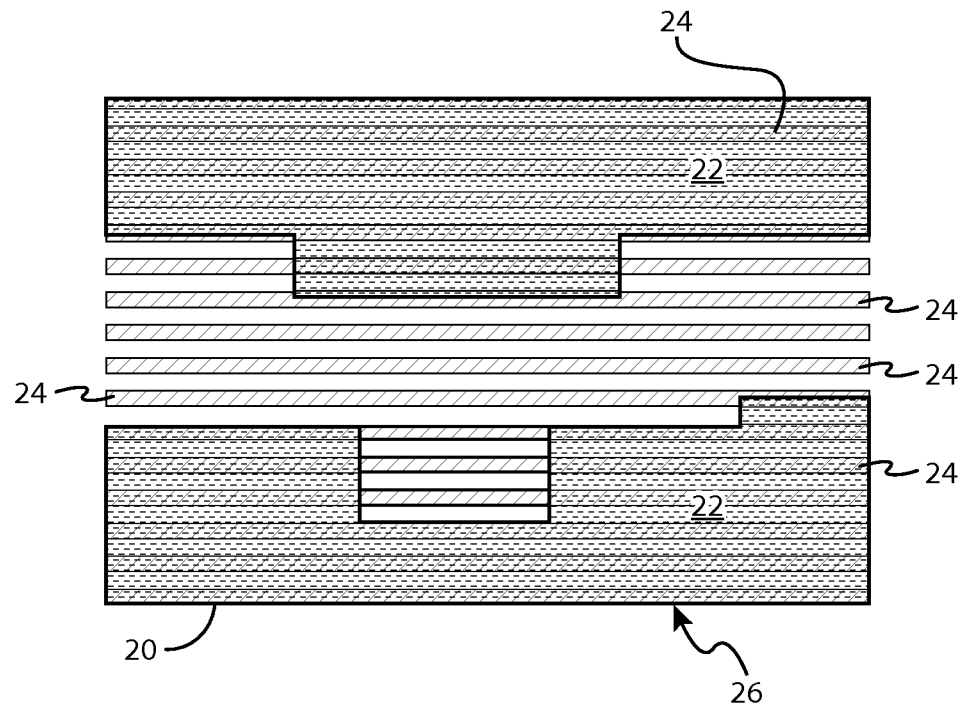
FIGS. 2A-2D together illustrate how the two fin-cut masks of FIGS. 2B and 2C are used in conjunction with one another to remove some of the fins shown in FIG. 2A, using the combined pattern shown in FIG. 2D, according to an embodiment of the disclosure.

FIG. 2A shows pattern portion 26 representing a portion of a semiconductor device. Pattern portion 26 includes multiple parallel fins 24 and also shows active areas 22 superimposed over the parallel fins 24. Active areas 22 represent the areas in which is desired to retain fins 24. The present disclosure provides for removing fins 24 from areas other than active areas 22 using a plurality of fin-cut masks.

Figure 2B:
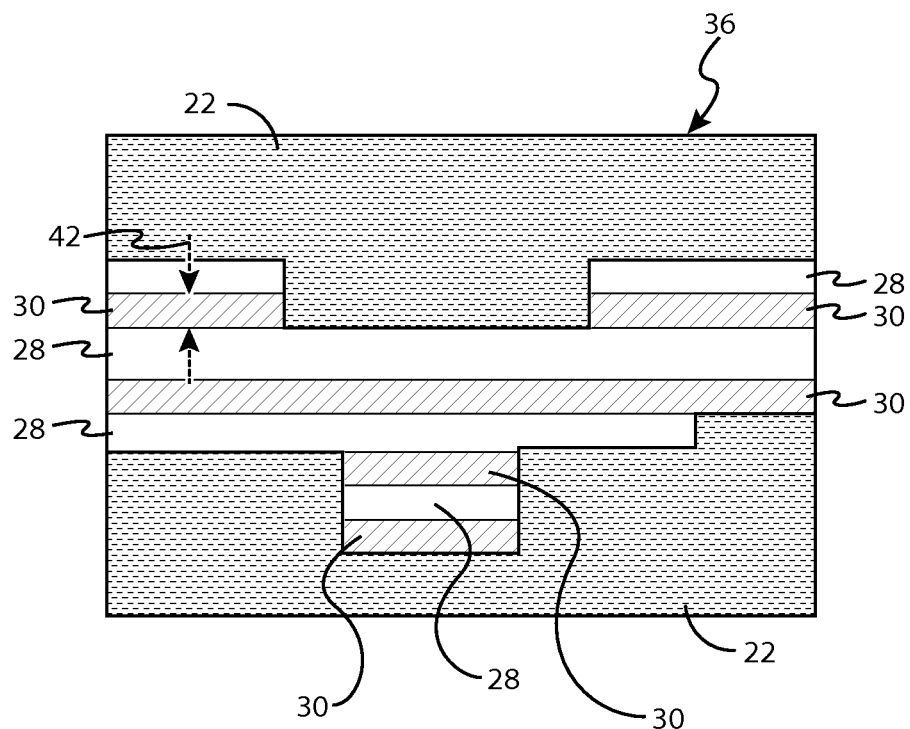
Figure 2C:
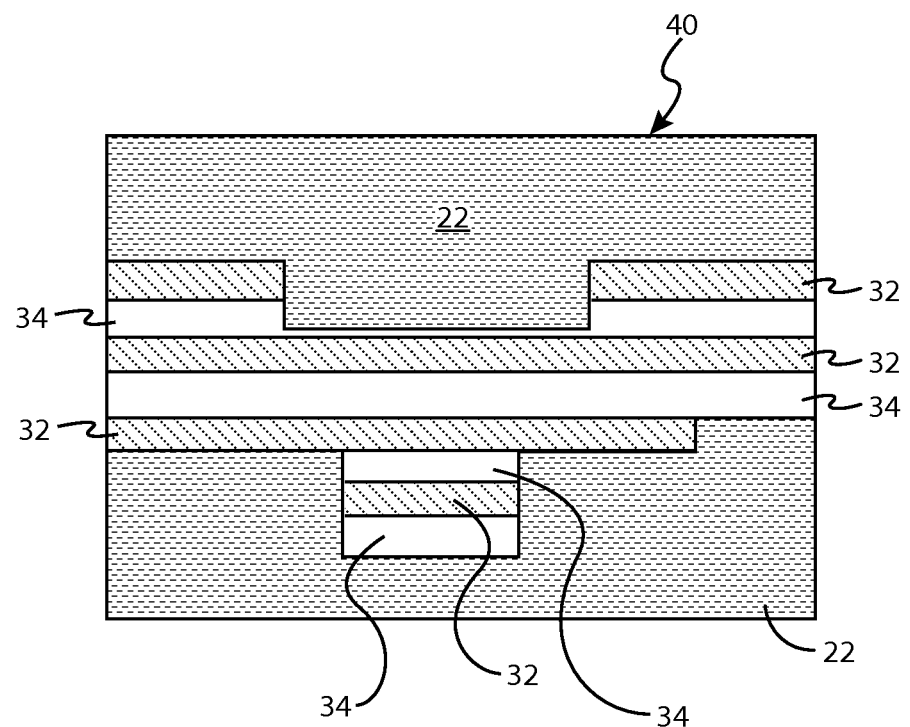

FIGS. 2B and 2C show portions of two fin-cut masks, 36, 40 that are used in combination to remove fins 24 from non-active areas 22 in the processing embodiment illustrated in FIG. 1, such as shown in FIG. 2A. Each of FIGS. 2B and 2C includes active areas 22. Fins 24 will remain in active areas 22, i.e. they will not be removed. First fin-cut mask 36 includes fin-cut regions 30 that are used to identify, expose and remove the corresponding fins 24 shown in FIG. 2A, from non-active areas 22. In the positive photoresist processing embodiment, fin-cut regions 30 are clear and alternate portions 28 and the portions corresponding to active areas 22 are opaque on first fin-cut mask 36. The opposite is true in negative photoresist systems. Second fin-cut mask 40 includes fin-cut regions 32 that are used to identify, expose and remove the corresponding fins 24 from non-active areas, as shown in FIG. 2B. In FIG. 2C, fin-cut regions 32 are clear and alternate regions 34 and the portions of second fin-cut mask 40 over active areas 22 are opaque with fin-cut regions 32 being clear according to the positive photoresist processing embodiment. The opposite is true in negative photoresist systems. FIGS. 2B and 2C are shown in alignment to show that fin-cut regions 30 of first fin-cut mask 36 appear in an alternating manner with fin-cut regions 32 of second fin-cut mask 40. The dimensions, e.g. width 42 of fin-cut regions such as fin-cut region 30, varies in various embodiments and depends upon the width of fins 24. In one embodiment, both the width of fin 24 and width 42 of fin-cut region 30 are about 50 nm but other widths are used in other embodiments. In some embodiments, fin-cut regions 30, 32 include the same width as fins 24 and in other embodiments, fin-cut regions 30, 32 have a slightly greater width than the corresponding fin 24. In each of first fin-cut mask 36 and second fin-cut mask 40, the pitch of fin-cut regions 30, 32 is fixed in the illustrated embodiment. In the illustrated embodiment, each fin-cut region 30 is a single strip corresponding to a fin 24. In other embodiments, fin-cut regions 30 and 32 include multiple slits, each corresponding to one fin, and according to this embodiment, each alternating group of two fins 24 is removed using an associated fin-cut region from a different fin-cut mask, each of which may include a fixed pitch throughout the mask, although fin-cut masks that do not include a fixed pitch throughout the mask, may be used in other embodiments.

Figure 2D:
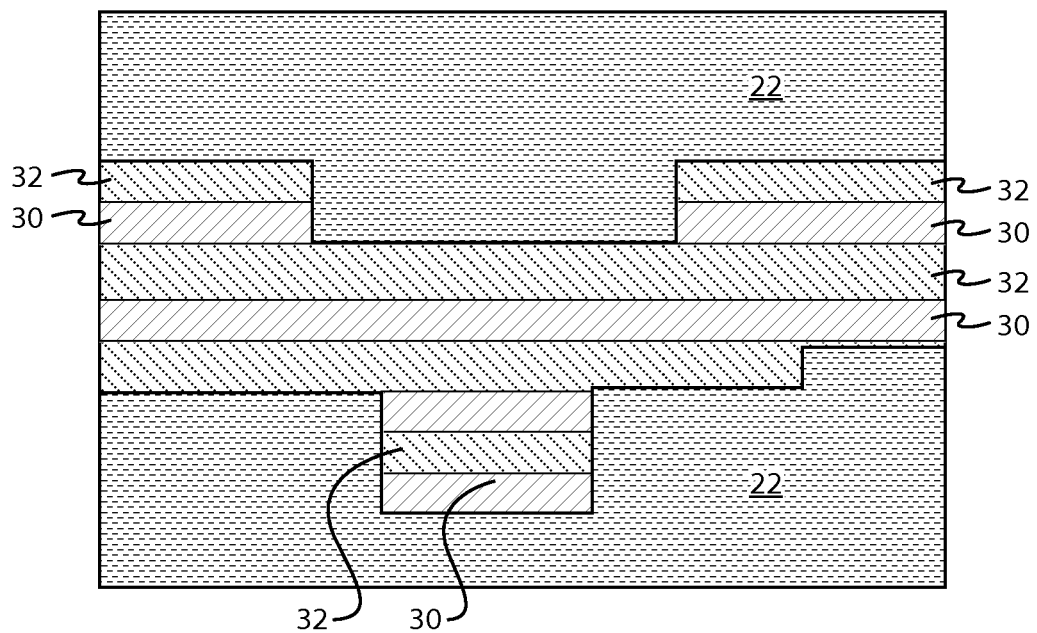

FIG. 2D represents a superimposed pattern including active areas 22, fin-cut regions 30 from first fin-cut mask 36 and fin-cut regions 32 from second fin-cut mask 40, even though first fin-cut mask 36 and second fin-cut mask 40 are used in separate patterning operations. It can be seen that fin-cut regions 30, 32 appear in an alternating manner. In combination, fin-cut regions 30, 32 expose and remove all fins from areas other active areas 22 in which the fins remain.

FIGS. 3A and 3B illustrate a cooperating pair of fin-cut masks. First fin-cut mask 50 is distinguished from second fin-cut mask 52. Respective notches 60, 62 show that when first fin-cut mask 50 is overlaid with second fin-cut mask 52, the respective first fin-cut regions 54 of first fin-cut mask 50 are parallel and adjacent and not overlying second fin-cut regions 64 of second fin-cut mask 52. First fin-cut mask 50 and second fin-cut mask 52 combine to form a pattern for removing fins using DPT technology. Each of first fin-cut mask 50 and second fin-cut mask 52 is illustrated in "reverse polarity" in the sense that the dark areas in the illustration of FIGS. 3A, 3B represent clear areas in the photomask and the clear areas in the illustration of FIGS. 3A, 3B represent opaque areas of a photomask according to the embodiment in which positive photoresist processing is used. When first fin-cut mask 50 and second fin-cut mask 52 are aligned and overlaid over an existing pattern of parallel fins formed on a semiconductor die, adjacent fins on the die correspond to fin-cut regions from different ones of first fin-cut mask 50 and second fin-cut mask 52. For example, first fin-cut region 54A of first fin-cut mask 50 is aligned adjacent second fin-cut region 64A of second fin-cut mask 52 and fin-cut regions 54A and 64A are associated with fins on a semiconductor device that are adjacent one another.

According to the embodiment in which positive photoresist is used, first fin-cut regions 54 and second fin-cut regions 64 represent clear strips and void areas 70 are opaque regions. Void areas 70 are part of the active areas within which fins will remain. In the illustrated embodiment, each first fin-cut region 54 and each second fin-cut region 64 corresponds to a single semiconductor fin and represents a single clear strip. Assist features 56, 66 are also clear areas. In other embodiments, first fin-cut regions 54 and second fin-cut regions 64 each include a plurality of clear strips and according to each of these embodiments, first fin-cut regions 54 and second fin-cut regions 64 include the same width as one another, first fin-cut regions 54 include a constant pitch throughout first fin-cut mask 50 and second fin-cut regions 64 include a fixed pitch throughout second fin-cut mask 52. In other embodiments, first fin-cut regions 54 and have a width ranging from 0.5 to 2.0 with respect the width of second fin-cut regions 64 and may not include a fixed-pitch. Each fin-cut region 54, 64 includes at least one clear strip that is dimensioned to form an exposure pattern on a fin formed on a substrate such that the exposure pattern can be developed and the exposed portion of the fin removed. Assist features 56, 66 are designed in conjunction with the photolithographic system used, and dimensioned such that they do not print on the semiconductor device being formed.

Figure 3C:
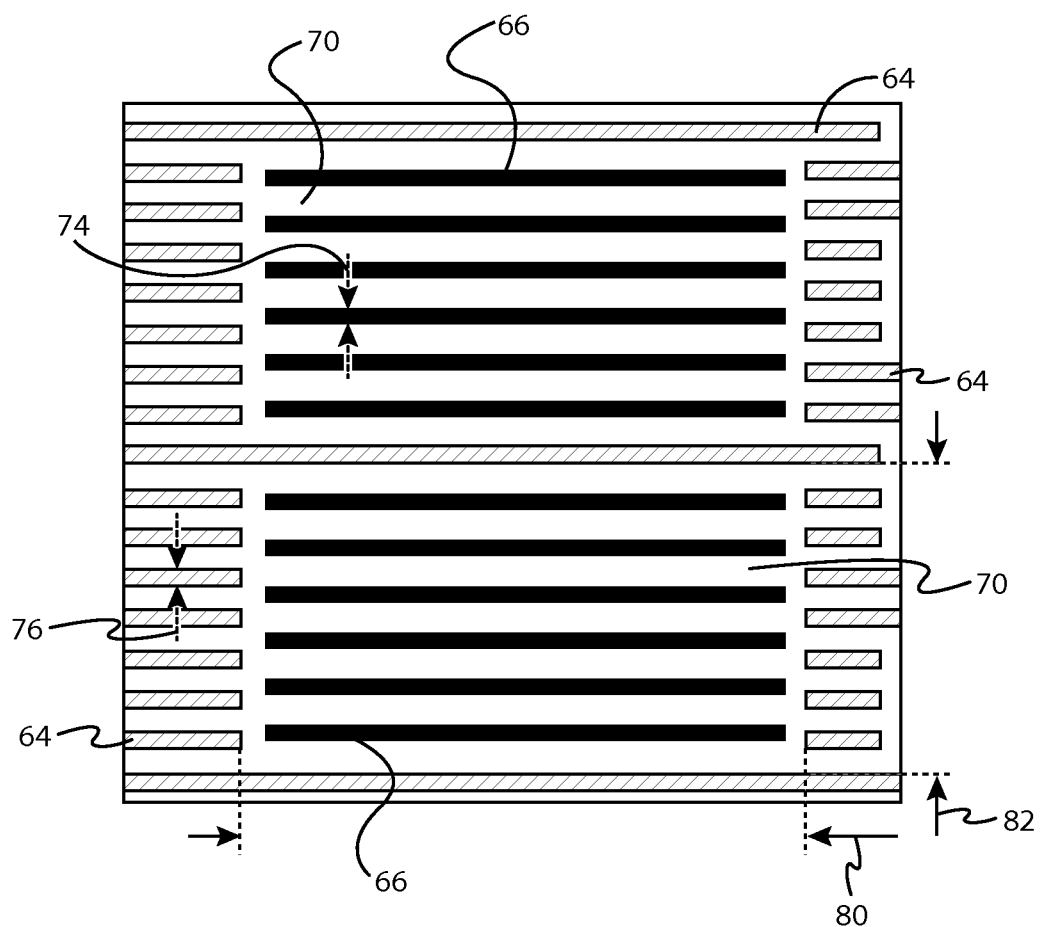
FIG. 3C shows an expanded portion of the fin-cut mask shown in FIG. 3B.

FIG. 3C shows an enlarged portion of second fin-cut mask 52. Width 74 of assist features 66 is smaller than width 76 of fin-cut regions 64. Assist features 66 are parallel one another and parallel to fin-cut region 64. In some embodiments, each assist feature 66 corresponds to an underlying fin. Assist features 66 represent clear strips in the positive photoresist embodiment, but width 74 is chosen in conjunction with the capabilities of the photolithography system to be too small to print on a substrate. As such assist features 66 are not printed on the semiconductor device and therefore do not result in the removal of fins. In other words, an active area defined by dimensions 80, 82 and including void areas 70 remain active areas, i.e. areas in which the fins are not removed. Assist features 56, 66 increase and improve the uniformity of the fin-cut masks. It should be noted that first fin-cut mask 50 and second fin-cut mask 52 each consist primarily of a series of parallel lines. In some embodiments, vertical assist features 58, 68 are used to correspond to ends of some fins being removed and include width that vary in various embodiments.

After fins are removed from non-active areas, the fins remain in the active areas and various methods are used in various embodiments to continue processing operations and form suitable FinFET devices that utilize the fins.

The fins are not present in the non-active areas, as they were removed using the fin-cut masks according to the processing embodiment illustrated in FIG. 1. In other embodiments, referred to as the cut-first embodiments, the fins are not present in the non-active areas because the trenches that will contain fins are formed only in the active areas using the cut-first technology described in U.S. patent application Ser. No. 12/625,957, referred to above.

In one embodiment, a mask set for forming a fin pattern in active areas on a semiconductor device, is provided. The mask set comprises: a fin mask with a pattern defining a plurality of parallel fins; a first fin-cut mask with a plurality of parallel first fin-cut regions outside of active areas of the semiconductor device, each first fin-cut region including at least one strip that corresponds to at least a portion of a fin of the plurality of parallel fins; and a second fin-cut mask with a plurality of parallel second fin-cut regions outside of the active areas. Each second fin-cut region includes at least one strip that corresponds to at least a portion of a fin of the plurality of parallel fins. The first and second fin-cut regions are parallel and appear in an alternating sequence with respect to the plurality of parallel fins, when the first and second fin-cut masks are overlaid.

In another embodiment, a method for forming a semiconductor device pattern on a die, is provided. The method comprises: defining active areas on the die; forming a pattern of a plurality of fins on the die, the fins being parallel one another; forming a first fin-cut pattern in first removal areas being areas other than the active areas, using a first fin-cut mask that includes a plurality of first fin-cut regions in the removal areas, each first fin-cut region including a strip corresponding to a first fin of the plurality of fins; and forming a second fin-cut pattern in second removal areas being areas other than the active areas, using a second fin-cut mask that includes a plurality of second fin-cut regions in the removal areas, each second fin-cut region including a strip corresponding to a second fin of the plurality of fins, wherein the first and second fin-cut regions are parallel and adjacent one another and in an alternating sequence with respect to the plurality of fins, in the semiconductor device pattern.

In another embodiment, a method for forming a semiconductor device, is provided. The method comprises: defining active areas on the die; forming a plurality of fins on the die, the fins being parallel one another and formed of a semiconductor material; forming a first fin-cut pattern using a first fin-cut mask, the first fin-cut pattern including parallel first fin-cut regions each having a clear strip corresponding to at least a portion of a first fin of the plurality of fins; and removing the first fins of the plurality of fins by developing and etching. The method also comprises: forming a second fin-cut pattern using a second fin-cut mask, the second fin-cut pattern including parallel second fin-cut regions each having a clear strip corresponding to at least a portion of a second fin of the plurality of fins; and removing the second fins of the plurality of fins by developing and etching; wherein the first and second fin-cut regions correspond, in an alternating sequence, to the fins of the plurality of fins.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A mask set for forming a fin pattern in active areas on a semiconductor device, said mask set comprising:
    a fin mask with a pattern defining a plurality of parallel fins;
    a first fin-cut mask with a plurality of parallel first fin-cut regions outside of active areas of said semiconductor device, each said first fin-cut region including at least one strip that corresponds to at least a portion of a fin of said plurality of parallel fins; and
    a second fin-cut mask with a plurality of parallel second fin-cut regions outside of said active areas, each said second fin-cut region including at least one strip that corresponds to at least a portion of a fin of said plurality of parallel fins,
    wherein said first and second fin-cut regions are arranged so as to be parallel and appear adjacent in an alternating sequence with respect to said plurality of parallel fins, when said first and second fin-cut masks are overlaid.

2. The mask set as in claim 1, wherein said first fin-cut regions and said second fin-cut regions have the same width.

3. The mask set as in claim 1, wherein said mask set is a positive photoresist mask set, each of said strips is a clear portion, and each said at least one strip of said first fin-cut region has a width of about 0.5 to 2.0 of a width of each said at least one strip of said second fin-cut region.

4. The mask set as in claim 3, wherein said first fin-cut regions and said second fin-cut regions include the same number of a plurality of said strips therein.

5. The mask set as in claim 1, wherein at least one of said first fin-cut mask and said second fin-cut mask includes assist features in active areas thereof, said assist features comprising second strips that are thinner than said strips.

6. The mask set as in claim 5, wherein said assist features include dimensions too small to be printed on said semiconductor device using a process that patterns said strips.

7. The mask set as in claim 5, wherein said assist features each correspond to a fin of said plurality of parallel fins.

8. The mask set as in claim 1, wherein each said first fin-cut region and each said second fin-cut region consist of only one said clear strip corresponding to one said fin of said plurality of parallel fins, and said first fin-cut regions are arranged to have a fixed pitch on said first fin-cut mask and said second fin-cut regions are arranged to have a fixed pitch on said second fin-cut mask.

9. The mask set as in claim 1, further comprising an active area mask with an active area pattern thereon.

10. A mask set for forming a fin pattern in active areas on a semiconductor device, said mask set comprising
    a fin mask with a pattern defining a photolithographic pattern including a plurality of parallel fins;
    a first fin-cut mask with a plurality of parallel first fin-cut regions in first removal areas of said photolithographic pattern outside of active areas of said semiconductor device, each said first fin-cut region including at least one strip that corresponds to at least a portion of a fin of said plurality of parallel fins; and
    a second fin-cut mask with a plurality of parallel second fin-cut regions in second removal areas of said photolithographic pattern outside of said active areas, each said second fin-cut region including at least one strip that corresponds to at least a portion of a fin of said plurality of parallel fins,
    wherein said first and second fin-cut regions are arranged so as to be parallel and appear adjacent in an alternating sequence with respect to said plurality of parallel fins.

11. The mask set as in claim 10, wherein said first fin-cut regions and said second fin-cut regions have the same width.

12. The mask set as in claim 10, wherein said mask set is a positive photoresist mask set, each of said strips is a clear portion, and each said at least one strip of said first fin-cut region has a width of about 0.5 to 2.0 of a width of each said at least one strip of said second fin-cut region.

13. The mask set as in claim 12, wherein said first fin-cut regions and said second fin-cut regions include the same number of a plurality of said strips therein.

14. The mask set as in claim 10, wherein at least one of said first fin-cut mask and said second fin-cut mask includes assist features in active areas thereof, said assist features comprising second strips that are thinner than said strips.

15. The mask set as in claim 14, wherein said assist features include dimensions too small to be printed on said semiconductor device using a process that patterns said strips.

16. The mask set as in claim 14, wherein said assist features each correspond to a fin of said plurality of parallel fins.

17. The mask set as in claim 10, wherein each said first fin-cut region and each said second fin-cut region has not more than one said clear strip corresponding to one said fin of said plurality of parallel fins, and said first fin-cut regions are arranged to have a fixed pitch on said first fin-cut mask and said second fin-cut regions are arranged to have a fixed pitch on said second fin-cut mask.

18. The mask set as in claim 10, further comprising an active area mask with an active area pattern thereon.

19. A mask set for forming a fin pattern in active areas on a semiconductor device, said mask set comprising:
   a fin mask with a pattern defining a plurality of parallel fins;
   a first fin-cut mask with a plurality of parallel first fin-cut regions, each said first fin-cut region including at least one strip that corresponds to at least a portion of a fin of said plurality of parallel fins; and
   a second fin-cut mask with a plurality of parallel second fin-cut regions, each said second fin-cut region including at least one strip that corresponds to at least a portion of a fin of said plurality of parallel fins,
   wherein said first and second fin-cut regions are arranged so as to be adjacent in an alternating sequence with respect to said plurality of parallel fins.

20. The mask set as in claim 19, wherein said mask set is a positive photoresist mask set, each of said strips is a clear portion, and each said at least one strip of said first fin-cut region has a width of about 0.5 to 2.0 of a width of each said at least one strip of said second fin-cut region, and wherein said first fin-cut regions and said second fin-cut regions include the same number of a plurality of said strips therein.

\* \* \* \* \*